(12) United States Patent
Noshiro et al.

(10) Patent No.: US 8,533,938 B2
(45) Date of Patent: Sep. 17, 2013

(54) METHOD OF MANUFACTURING RESISTANCE CHANGE ELEMENT

(75) Inventors: Hideyuki Noshiro, Kawasaki (JP); Kentaro Kinoshita, Tottori (JP)

(73) Assignee: Fujitsu Limited, Kawasaki (JP)

( * ) Notice: Subject to any disclaimer, the term of this patent is extended or adjusted under 35 U.S.C. 154(b) by 690 days.

(21) Appl. No.: 12/519,805

(22) Filed: Jun. 18, 2009

(65) Prior Publication Data
US 2010/0083487 A1 Apr. 8, 2010

Related U.S. Application Data

(63) Continuation of application No. PCT/JP2006/325300, filed on Dec. 19, 2006.

(51) Int. Cl.
*H01C 17/06* (2006.01)
(52) U.S. Cl.
USPC ............. 29/620; 29/829; 29/846; 438/382; 438/593
(58) Field of Classification Search
USPC ............. 29/620, 610.1, 623, 825, 829, 846; 257/4, 43, E21.002, E21.004, E21.214, E21.409, 257/E45.003; 438/104, 222, 382, 593, 678, 438/900
See application file for complete search history.

(56) References Cited

U.S. PATENT DOCUMENTS

| | | | |
|---|---|---|---|
| 7,420,198 B2 | 9/2008 | Baek et al. | |
| 7,525,832 B2 | 4/2009 | Muraoka et al. | |
| 7,741,669 B2 | 6/2010 | Baek et al. | |
| 2004/0245557 A1 | 12/2004 | Seo et al. | |
| 2005/0153504 A1 | 7/2005 | Kawazoe et al. | |
| 2005/0206892 A1 | 9/2005 | Wang et al. | |
| 2006/0054950 A1 | 3/2006 | Baek et al. | |
| 2006/0098472 A1 | 5/2006 | Ahn et al. | |
| 2006/0131554 A1 * | 6/2006 | Joung et al. | 257/2 |
| 2007/0048990 A1 * | 3/2007 | Zhuang et al. | 438/593 |
| 2009/0008620 A1 | 1/2009 | Baek et al. | |
| 2009/0067215 A1 | 3/2009 | Muraoka et al. | |
| 2010/0224850 A1 | 9/2010 | Baek et al. | |

FOREIGN PATENT DOCUMENTS

| | | |
|---|---|---|
| EP | 1555700 A2 | 7/2005 |
| JP | 2004-363604 A | 12/2004 |
| JP | 2005-203389 A | 7/2005 |
| JP | 2006-140489 A | 6/2006 |
| JP | 2006-324447 A | 11/2006 |

(Continued)

OTHER PUBLICATIONS

European Search Report dated Dec. 22, 2010, issued in corresponding European Patent Application No. 06834970.3.

(Continued)

*Primary Examiner* — Thiem Phan
(74) *Attorney, Agent, or Firm* — Westerman, Hattori, Daniels & Adrian, LLP

(57) ABSTRACT

In a resistance change memory (ReRAM) storing data by utilizing change in resistance of a resistance change element, a transistor T, interlayer insulating films, W plugs and the like are formed on a semiconductor substrate. Thereafter, a Pt film serving as a lower electrode of the resist change element is formed and a transition metal film (Ni film) is formed on the Pt film. After that, the surface of the transition metal film is oxidized to form a transition metal oxide film and a Pt film serving as an upper electrode is formed on the transition metal oxide film.

4 Claims, 8 Drawing Sheets

(56) References Cited

FOREIGN PATENT DOCUMENTS

| KR | 2006-0023860 A | 3/2006 |
| --- | --- | --- |
| WO | 2005/024839 A1 | 3/2005 |
| WO | 2006/115208 A1 | 11/2006 |

OTHER PUBLICATIONS

Gibbons, J. F. et al.; "Switching Properties of Thin NiO films"; Solid-State Electronics UK, vol. 7, No. 11, Nov. 1964, pp. 785-797, XP2612768.

Courtade, L. et al.; "Microstructure and resistance switching in NiO binary oxide films obtained from Ni oxidation"; Non-Volatile Memory Technology Symposium, 2006. NVMTS 2006. 7th Annual, IKEEE, PI, Nov. 1, 2006, pp. 94-99, XP031175743.

Korean Office Action dated Feb. 17, 2011, issued in corresponding Korean Patent Application No. 10-2009-7012532.

International Search Report of PCT/JP2006/325300, Mailing Date of Mar. 6, 2007.

K. Kinoshita et al., "Bias Polarity Dependent Data Retention of Resistive Random Access Memory Consisting of Binary Transition Metal Oxide," Applied Physics Letters. Published Sep. 6, 2006, vol. 89, pp. 103509-1-103509-3, cited in ISR.

S. Seo et al., "Reproducible Resistance Switching in Polycrystalline NIO Films," Applied Physics Letters, vol. 85, No. 23, Dec. 6, 2004, pp. 5655-5657, cited in ISR.

European Office Action dated Sep. 5, 2011, issued in corresponding European Patent Application No. 06834970.3.

\* cited by examiner

METHOD OF MANUFACTURING RESISTANCE CHANGE ELEMENT

CROSS-REFERENCE TO RELATED APPLICATIONS

This application is a continuation of prior International Patent Application No. PCT/JP2006/325300, filed Dec. 19, 2006, the entire contents of which are incorporated herein by reference.

FIELD

The embodiment discussed herein relates to a method of manufacturing a resistance change element storing data by utilizing change in a resistance value.

BACKGROUND

In recent years, further size reduction, lower power consumption and higher functionality have been demanded for information apparatuses such as computers. Along with these demands, there has also been a demand for non-volatile semiconductor memories that enable higher integration, operate at a higher speed, and retain stored data even when power is not supplied. As one of the next generation non-volatile semiconductor memories capable of meeting such demands, a resistance change memory (Resistive Random Access Memory: hereinafter referred to as "ReRAM") including a resistance change element has been developed (see, for example, Non Patent Citations 1, 2).

In a ReRAM, data is stored by utilizing change in a resistance value of a resistance change element. As depicted in FIG. 1, the resistance change element is configured such that an NiO film (nickel oxide film) 12 or another transition metal oxide film is sandwiched in between a pair of electrodes 11$a$, 11$b$ made of Pt (platinum). When a treatment applying a predetermined voltage to the resistance change element configured as such (electroforming: hereinafter referred to as "forming") is carried out, it is possible to change the resistance value by controlling the current and voltage.

FIG. 2 is a view depicting the state change of the resistance change element by taking the horizontal axis as voltage and the vertical axis as current. As depicted in this FIG. 2, the resistance change element transitions between a high resistance state and a low resistance state according to the current flowing through the inside of the resistance change element and the voltage applied thereto. In the high resistance state, as depicted by a in the Figure, the current flowing through the inside of the resistance change element increases as the applied voltage becomes higher, while the inclination of the curved line depicting the relationship between the voltage and the current is relatively small. In contrast, when the applied voltage becomes equal to or higher than a specified voltage (as depicted by b in FIG. 2), the resistance value decreases rapidly (as depicted by c in the figure). As a result, the current increases rapidly. For this reason, a limiter circuit for preventing rapid current increase is provided for the ReRAM so as to prevent a large current from flowing into the resistance change element.

In the low resistance state, as depicted by d in the Figure, the inclination of the curved line depicting the relationship between the voltage and the current is large. When the current flowing into the resistance change element becomes a specified value (as depicted by e in the Figure), the resistance change element transitions to the high resistance state (as depicted by f in the Figure), and the current decreases rapidly.

As described above, the resistance change element transitions to the low resistance state when a voltage equal to or higher than a specified voltage is applied in the high resistance state, while the resistance change element transitions to the high resistance state when a current equal to or higher than a specified current is applied in the low resistance state. The resistance value in the low resistance state is approximately several k$\Omega$ and the resistance value in the high resistance state is from approximately several tens k$\Omega$ to 1 M$\Omega$. Note that, in general, the change from the high resistance state to the low resistance state is referred to as "set" and the change from the low resistance state to the high resistance state is referred to as "reset".

Since the NiO film constituting the resistance change element is an oxide, the electrodes holding both sides of the NiO film is in an easily-oxidizable state. For this reason, the electrodes of the resistance change element are formed of a metal which is hardly oxidized. Specifically, the electrodes are formed of a noble metal such as Pt or Ir (iridium). Patent Citation 1 describes a non-volatile memory having a resistance change element with the structure in which a film made of any of transition metal oxides such as NiO, TiO$_2$, HfO, ZrO, ZnO, WO$_3$, CoO, and Nb$_2$O$_5$ is sandwiched in between a pair of electrodes.

Patent Citation 1: Japanese Laid-open Patent Application Publication No. 2006-140489

Non Patent Citation 1: K. Kinoshita et al., "Bias polarity dependent data retention of resistive random access memory consisting of binary transition metal oxide", APPLIED PHYSICS LETTER 89, 103509 (2006)

Non Patent Citation 2: S. Seo et al., "Reproducible resistance switching in polycrystalline NiO films", APPLIED PHYSICS LETTER Vol. 85, No. 23, 6 Dec. 2004)

SUMMARY

According to an aspect of the embodiment, a method of manufacturing a resistance change element includes forming a first noble metal film made of any one of a noble metal and a noble metal oxide above a semiconductor substrate, forming a transition metal film on the first noble metal film, forming a transition metal oxide film by oxidizing a surface of the transition metal film, and forming a second noble metal film made of any one of a noble metal and a noble metal oxide on the transition metal oxide film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENT

Figure 2:
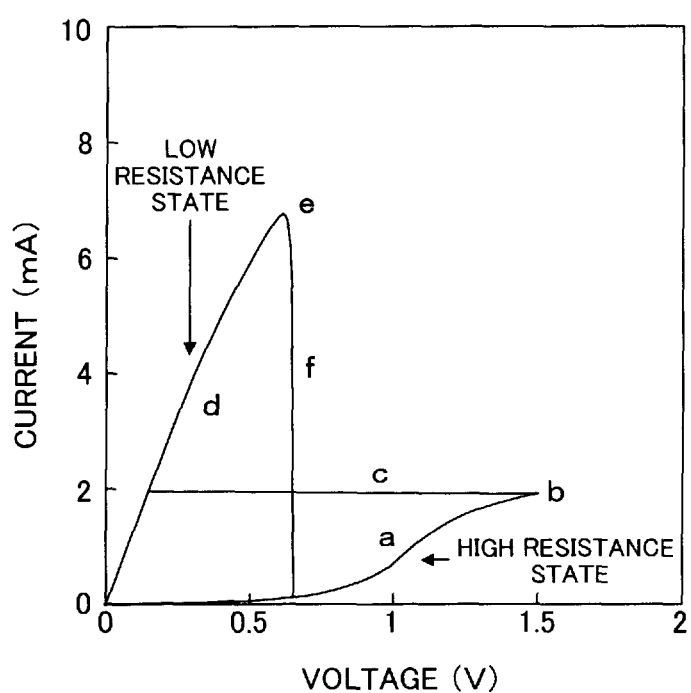
FIG. 2 is a view depicting an example of the state change of the resistance change element.

The inventors of the present application and the like have found the following problem in a related ReRAM. Specifically, as depicted in FIG. 2, a related resistance change element needs to receive a current of several mA to 10 mA or more in order to transition from the low resistance state to the high resistance state. On the other hand, unless a current flowing through each cell is set to be equal to or less than 1 mA, the power consumption of a semiconductor storage device (IC) is so huge, but depending on its required memory capacity, that the commercialization thereof is difficult.

The inventors of the present application and the like have carried out various experiments and studies with an intention to reduce the driving current of ReRAM. As a result, it has been found that the driving current of a resistance change element can be reduced when an Ni (nickel) film is formed on the ground-side (negative polarity-side) electrode of the resistance change element and a transition metal oxide film (NiOx film) is formed by performing an oxidation treatment to the surface of the Ni film. It is not apparent why the driving current decreases when the Ni film is formed between the ground-side electrode and transition metal oxide film of the resistance change element. However, it can be assumed that if there is no Ni film, the diffusion of elements from the noble metal electrode to the transition metal oxide film or the diffusion of oxygen from the transition metal oxide film to the noble metal electrode occurs to cause driving voltage to be higher and driving current to be larger, whereas if the Ni film is formed between the ground-side electrode and the transition metal oxide film, such a phenomenon does not occur.

Hereinafter, a preferred embodiment will be described with reference to the accompanying drawings.

Figure 3:
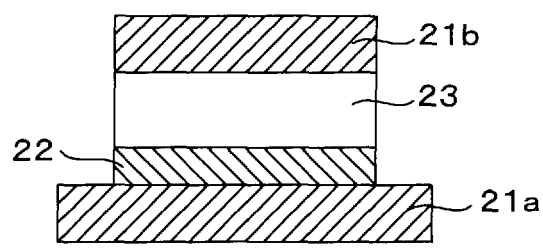
FIG. 3 is a cross-sectional view depicting a resistance change element according to an embodiment.

FIG. 3 is a cross-sectional view depicting a resistance change element according to an embodiment. As depicted in this FIG. 3, the resistance change element according to the present embodiment is configured by laminating, in the following order from the bottom thereof, a lower electrode (ground-side electrode) 21a made of Pt (platinum), a transition metal film 22 made of Ni (nickel), a transition metal oxide film 23 made of NiOx (nickel oxide film), and an upper electrode (positive polarity-side electrode) 21b made of Pt. Here, x in NiOx is any positive number, and is preferably larger than 0 and less than 2 in order to obtain a preferable characteristic.

The lower electrode 21a and the upper electrode 21b may be formed of a noble metal other than Pt, for example, Pd (palladium), Ru (ruthenium), or Ir (iridium), or an oxide thereof. In the present embodiment, the lower electrode 21a is formed of Pt. Subsequently, the transition metal film 22 is formed by sputtering Ni onto the lower electrode 21a. After that, the surface of the transition metal film 22 is oxidized in an oxidizing atmosphere to form the transition metal oxide film 23 made of NiOx. In this case, if the entire transition metal film 22 is oxidized, the effect of reducing a driving current cannot be obtained. Therefore, it is necessary to adjust a temperature and time of oxidation treatment so as to control the thickness of the remaining transition metal film 22. For this reason, it is significant to check in advance the relationship between the temperature and time of oxidation treatment and the thickness of the remaining transition metal film. The thicknesses of the transition metal film and the transition metal oxide film after oxidation treatment are checked by the cross-sectional SEM (Scanning Electron Microscope) observation, the film crystallinity measurement, or the elemental analysis in the depth direction by using the XPS (X-ray Photoelectron Spectroscopy).

Figure 4:
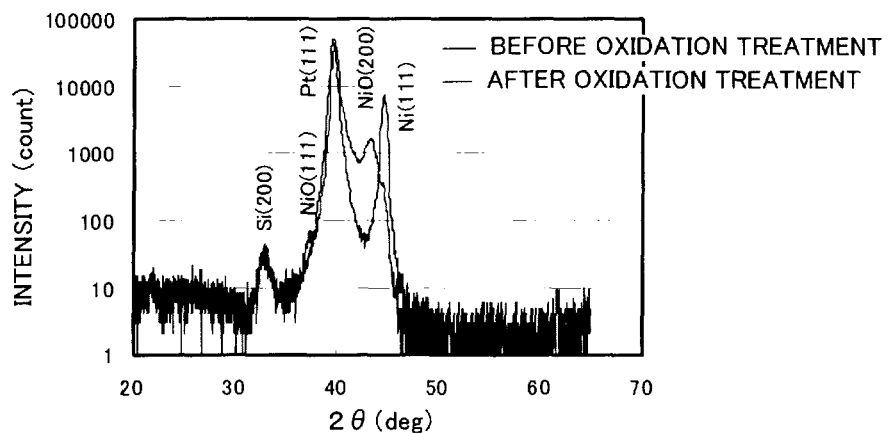
FIG. 4 is a view depicting the results of measuring a sample before oxidation treatment and a sample after oxidation treatment with X-ray diffraction (XRD)

FIG. 4 is a view depicting the results of measuring a sample before oxidation treatment and a sample after oxidation treatment with the X-ray diffraction (XRD) by taking the horizontal axis as angle (2θ) and the vertical axis as intensity (count). It should be noted that the sample used for the measurement is such that a metal film (lower electrode) made of Pt is formed on a silicon substrate and an Ni film with the thickness of 60 nm is formed thereon by the sputtering method. In addition, the oxidation treatment is performed by heating at 400° C. for 30 minutes in the oxidizing atmosphere.

As can be seen from FIG. 4, in the sample before oxidation treatment, only the peaks of Si (200), Pt (111), and Ni (111) are observed. However, in the sample after oxidation treatment, the peak of NiO (200) is also observed in addition to the peaks of Si (200), Pt (111), and Ni (111). From this result, it can be seen that an NiOx film is formed and the Ni film also remains after the oxidation treatment when the oxidation treatment is performed by heating at 400° C. for 30 minutes.

Figure 5:
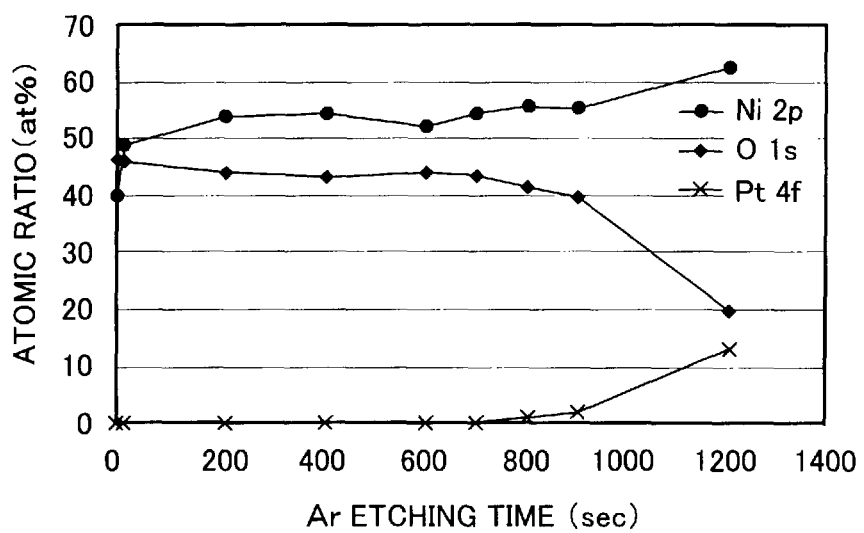
FIG. 5 is a view depicting the results of performing an elemental analysis in the depth direction of the sample after oxidation treatment with XPS.

FIG. 5 is a view depicting the results of performing the elemental analysis in the depth direction of the sample after oxidation treatment with the XPS by taking the horizontal axis as etching time and the vertical axis as atomic ratio. Here, an Ar gas is used for the etching.

It can be seen from this FIG. 5 that the atomic ratio of oxygen is high when the etching time is 0 to 900 seconds, and when the etching time exceeds 900 seconds, the atomic ratio of oxygen decreases and the atomic ratio of Ni increases. This means that unoxidized Ni remains in the vicinity of the lower electrode. As a result obtained by observing the cross-section of the sample after oxidation treatment with the SEM, the thickness of the unoxidized Ni film is 10 nm.

Figure 6:
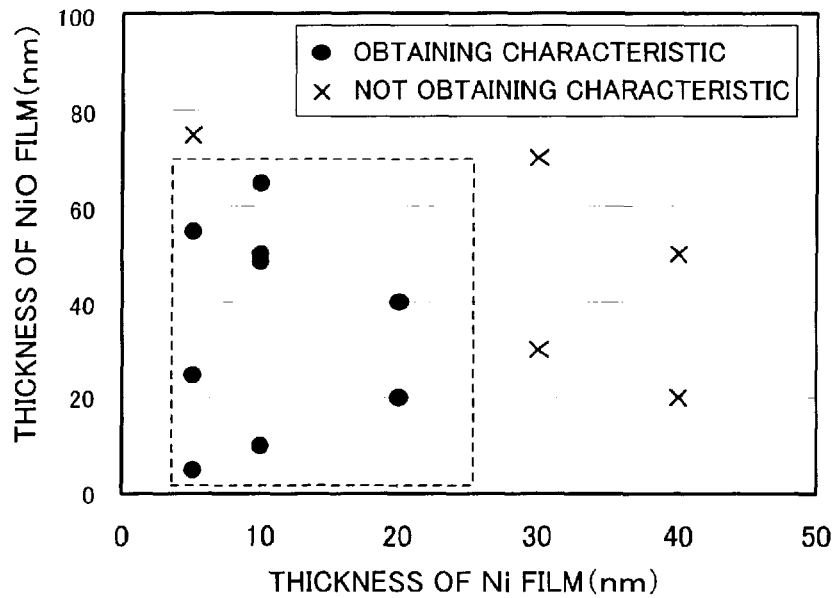
FIG. 6 is a view depicting the results of checking the relationship between the thickness and characteristic of a transition metal film (Ni film) and transition metal oxide film (NiOx film)

Next, in the configuration depicted in FIG. 3, the inventors of the present application and the like formed a large number of resistance change elements, each having different thicknesses of the transition metal film (Ni film) 22 and the transition metal oxide film (NiOx film) 23, and checked characteristics thereof. FIG. 6 depicts these results. As depicted in this FIG. 6, the preferable resistance change characteristic is indicated only when the thickness of the transition metal film (Ni film) is between 5 nm and 20 nm inclusive and the thickness of the transition metal oxide film (NiOx film) is between 5 nm and 65 nm inclusive (the range surrounded by the broken line in the figure) and the preferable resistance change characteristic is not indicated in a range other than that. That is, the resistance value is excessively low if the thickness of the transition metal oxide film is less than 5 nm. As a result, the resistance value required in a high resistance state cannot be obtained. In addition, if the thickness of the transition metal oxide film exceeds 65 nm, the resistance value is excessively high. As a result, the resistance value required in a low resistance state cannot be obtained. Furthermore, if the thickness of the transition metal film is less than 5 nm, the effect of reducing the reset current cannot be sufficiently obtained.

Although it is not apparent why the characteristic cannot be sufficiently obtained when the thickness of the transition metal film (Ni film) exceeds 20 nm, it is presumable that the reaction between Pt and Ni develops to lead to an increase in unevenness on the surface of the NiOx film.

Figure 7:
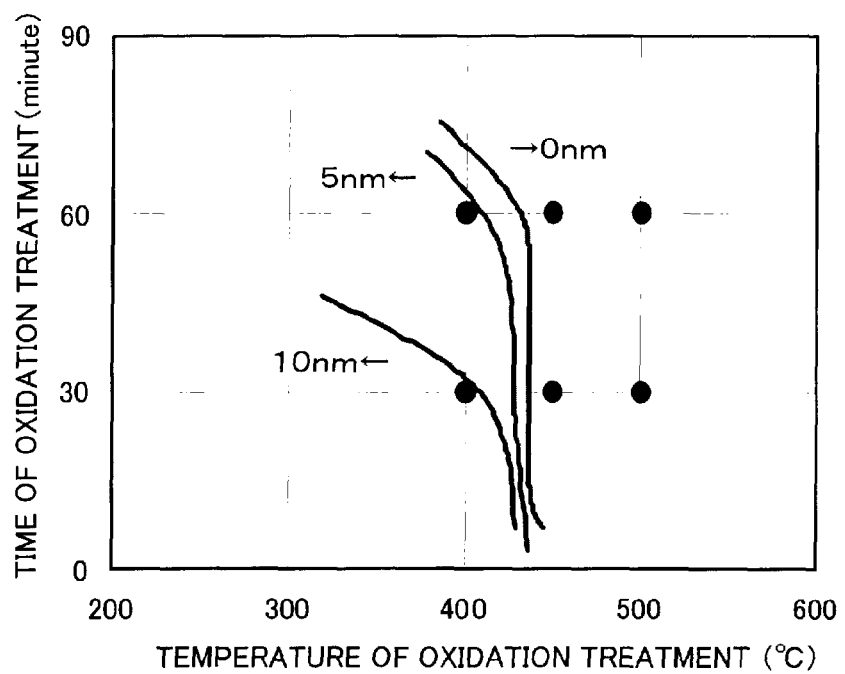
FIG. 7 is a view depicting the results of checking the condition when the thickness of the Ni film after oxidation treatment is set to be 5 nm or 10 nm.

FIG. 7 is a view depicting the results of checking the condition in a case where the thickness of the Ni film after oxidation treatment is 5 nm or 10 nm by taking the horizontal axis as temperature of the oxidation treatment and the vertical axis as time of the oxidation treatment. It should be noted that the results of checking the condition when the Ni film disappears is also depicted in FIG. 7.

Figure 1:
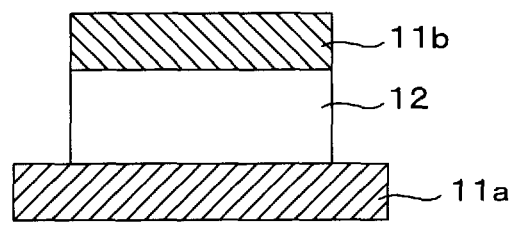
FIG. 1 is a cross-sectional view depicting a related resistance change element.
Figure 8:
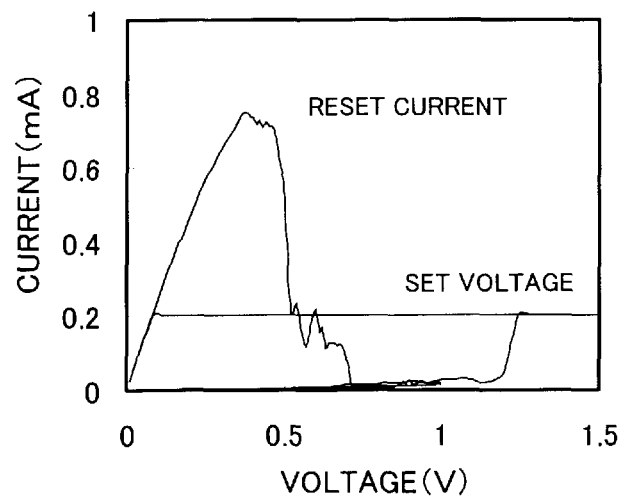
FIG. 8 is a view depicting the characteristic of the resistance change element according a practical example.
Figure 9:
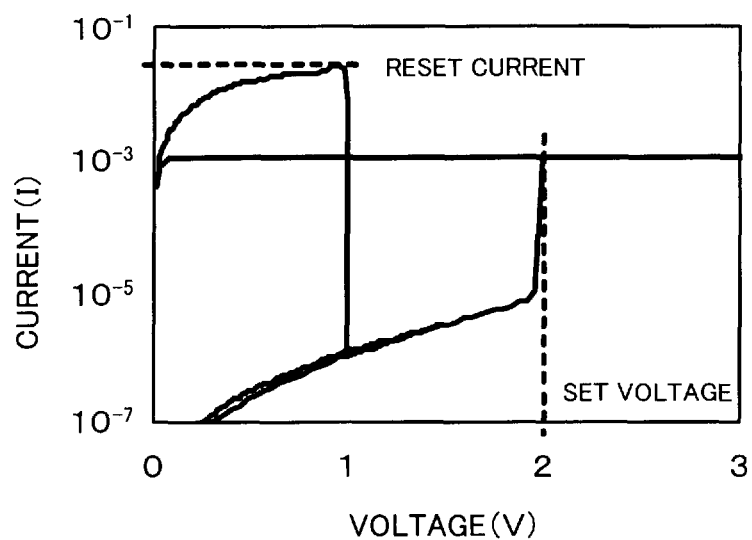
FIG. 9 is a view depicting the characteristic of a resistance change element according to a comparative example.

FIG. 8 is a view depicting the characteristic of the resistance change element formed according to a method of the embodiment (hereinafter referred to as a practical example) by taking the horizontal axis as voltage and the vertical axis as current. FIG. 9 is a view depicting the characteristic of a resistance change element (hereinafter referred to as a comparative example) with the structure depicted in FIG. 1.

As can be seen from FIG. 8, in the resistance change element according to the practical example formed according to a method of the embodiment, the set voltage is approximately 1.2 V and the reset current is approximately 0.8 mA, which are low. In contrast, as can be seen from FIG. 9, in the resistance change element according to the comparative example, the set voltage is approximately 2 V and the reset current is approximately 20 mA, which are large.

In FIG. 3, the transition metal film 22 may be formed of a transition metal other than Ni, for example, Ti (titanium), Co (cobalt), or Ta (tantalum). In the present invention, the transition metal oxide film 23 is formed by oxidizing the surface of the transition metal film 22. Accordingly, when the transition metal film 22 is made of Ti, the transition metal oxide film 23 is formed of $TiO_2$. When the transition metal film 22 is made of Co, the transition metal oxide film 23 is formed of CoO. When the transition metal film 22 is made of Ta, the transition metal oxide film 23 is formed of $Ta_2O_5$.

(Manufacturing Method of ReRAM)

FIGS. 10A to 10J are cross-sectional views, each depicting in the order of processes a method of manufacturing a ReRAM according to the embodiment. In general, a memory cell as well as an n-type transistor and a p-type transistor which constitute driving circuits (a write circuit, a read circuit and the like) are formed on a semiconductor substrate, but are not depicted in the figures herein.

Figure 10A:
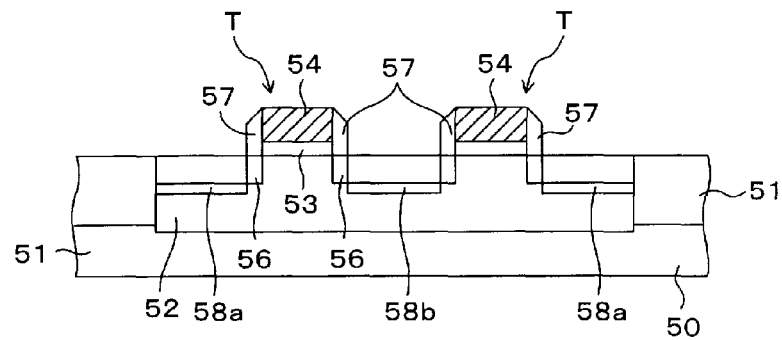
FIGS. 10A-10J are cross-sectional views depicting a method of manufacturing a ReRAM according to the embodiment.

Firstly, the process to form the structure depicted in FIG. 10A will be described. As depicted in FIG. 10A, an element isolation film 51 is formed in a predetermined region in a semiconductor substrate (silicon substrate) 50 by the well-known STI (Shallow Trench Isolation) method or the LOCOS (Local Oxidation of Silicon) method. The surface of the semiconductor substrate 50 is separated into multiple element regions by the resultant element isolation film 51.

Next, a p-type impurity such as boron (B) is introduced into an n-type transistor forming region (a memory cell region and an n-type transistor forming region of the driving circuit; hereinafter, the same) in the semiconductor substrate 50 to form a p-well 52. In addition, an n-type impurity such as phosphorus (P) is introduced into a p-type transistor forming region (a p-type transistor forming region of the driving circuit; hereinafter, the same) in the semiconductor substrate 50 to form an n-well (unillustrated).

Subsequently, the surfaces of the p-well 52 and the n-well (unillustrated) are thermally oxidized to form a gate insulating film 53. After that, a polysilicon film is formed on the entire upper surface of the semiconductor substrate 50 by the CVD (Chemical Vapor Deposition) method. The resultant polysilicon film is patterned by the photolithography method and the etching method to form gate electrodes 54. At this time, as depicted in FIG. 10A, in the memory cell region, the two gate electrodes 54 serving as word lines are disposed on one p-well 52 so as to be parallel to each other.

Thereafter, using the gate electrodes 54 as masks, an n-type impurity such as phosphorus (P) with low concentration is ion-implanted into the p-well 52 in the n-type transistor forming region, so that n-type low concentration impurity regions 56 are formed. Similarly, using the gate electrodes 54 as masks, a p-type impurity such as boron (B) with low concentration is ion-implanted into the n-well (unillustrated) in the p-type transistor forming region, so that p-type low concentration impurity regions (unillustrated) are formed.

Thereafter, side walls 57 are formed on both sides of the gate electrode 54. These side walls 57 are formed such that an insulating film made of $SiO_2$, SiN, or the like is formed on the entire upper surface of the semiconductor substrate 50 by the CVD method, and then the resultant insulating film is etched back to be left only on the both sides of the gate electrode 54.

Thereafter, using the gate electrode 54 and the side walls 57 as masks, an n-type impurity with high concentration is ion-implanted into the p-well 52 in the n-type transistor forming region, so that the re-type high concentration impurity regions 58a, 58b are formed. Here, the high concentration impurity region 58a is an impurity region (drain) disposed between the gate electrode 54 and the element isolation film 51. The high concentration impurity region 58b is an impurity region (source) disposed between the two gate electrodes 54.

Similarly, using the gate electrode and side walls in the p-type transistor forming region as masks, a p-type impurity with high concentration is ion-implanted into the n-well (unillustrated) to from a p-type high concentration impurity region (unillustrated). In this manner, the transistor T having a source and a drain with the LDD (Lightly Doped Drain) structure in each transistor forming region is formed.

Figure 10B:
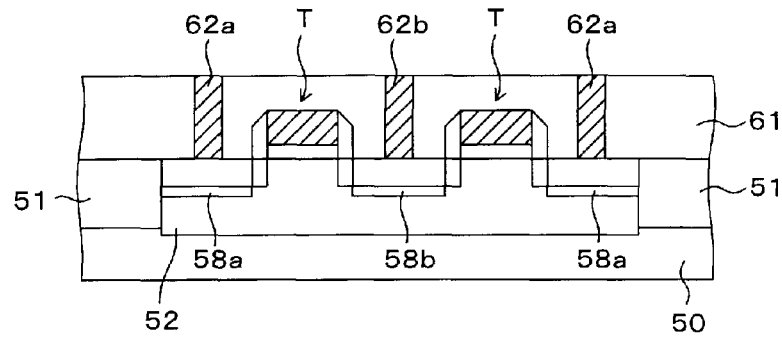

Next, the process to form the structure depicted in FIG. 10B will be described. After the transistor T is formed by the process described above, an $SiO_2$ film, for example, is formed as a first interlayer insulating film 61 on the entire upper surface of the semiconductor substrate 50 by the CVD method. The transistor T is covered with the resultant interlayer insulating film 61. After that, the surface of the first interlayer insulating film 61 is polished and planarized by the CMP (Chemical Mechanical Polishing) method.

Subsequently, by using the photolithography method and the etching method, contact holes reaching the n-type high concentration impurity regions 58a, 58b in the n-type transistor forming region from the upper surface of the first interlayer insulating film 61 are formed. After that, a TiN film (unillustrated) serving as a barrier metal is formed on the entire upper surface of the semiconductor substrate 50 by the sputtering method. Thereafter, a W film is formed on the TiN film by the sputtering method or the CVD method, while W is filled in the contact holes. After that, the W film and the TiN film are polished by the CMP method until the first interlayer insulating film 61 is exposed. In this manner, W plugs 62a, 62b made by being filled with W are formed in the contact holes. Here, the W plug 62a is a plug connected to the high concentration impurity region 58a and the W plug 62b is a plug connected to the high concentration impurity region 58b.

Figure 10C:
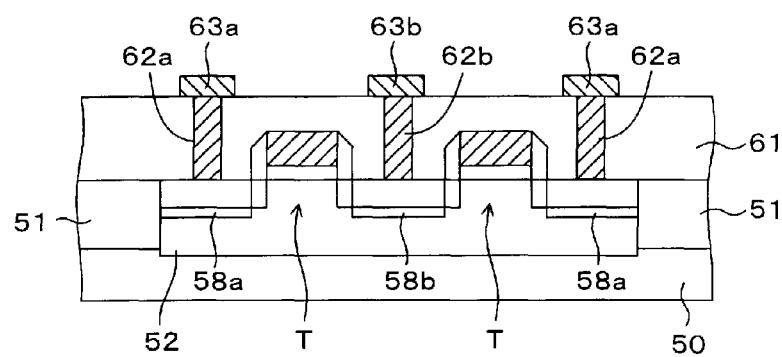

Next, the process to form the structure depicted in FIG. 10C will be described. After the W plugs 62a, 62b are formed by the process described above, a conducting film formed of a metal such as aluminum or copper is formed on the first interlayer insulating film 61 and the W plugs 62a, 62b by the sputtering method. Subsequently, the resultant conducting film is patterned by the photolithography method and the etching method to form pad 63a and wiring 63b. The pad 63a is formed on the W plug 62a and is electrically connected to the W plug 62a. In addition, the wiring 63b passes on the plug 62b and is electrically connected to the W plug 62b.

Figure 10D:
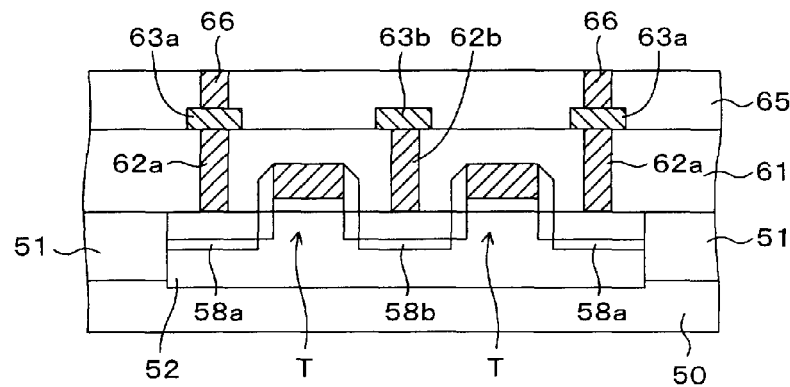

Next, the process to form the structure depicted in FIG. 10D will be described. After the pad 63a and the wiring 63b are formed by the process described above, a second interlayer insulating film 65 made of $SiO_2$ is formed on the entire upper surface of the semiconductor substrate 50 by the CVD method. Subsequently, the surface of the resultant interlayer insulating film 65 is polished and planarized by the CMP method. Thereafter, by using the photolithography method and the etching method, contact holes, each reaching the pad 63a from the upper surface of the second interlayer insulating film 65, are formed. After that, a TiN film (unillustrated) serving as a barrier metal is formed on the entire upper surface of the semiconductor substrate 50 by the sputtering method. Thereafter, a W film is formed on the TiN film by the sputtering method or the CVD method, while W is filled in the contact holes. After that, the W film and the TiN film are polished by the CMP method until the second interlayer insulating film 65 is exposed. In this manner, W plug 66 made by being filled with W is formed in the contact holes.

Next, the process to form the structure depicted in FIGS. 10E to 10G will be described. After the W plug 66 is formed by the process described above, a Ti or TiN film (unillustrated) is formed, with the thickness of, for example, 20 nm, on the second interlayer insulating film 65 and the W plug 66 by the sputtering method. This Ti or TiN film is not a must, but serves to improve the adhesiveness between the interlayer insulating film 65 and the lower electrode 67a as well as the electrical connectivity between the W plug 66 and the lower electrode 67a.

Figure 10E:
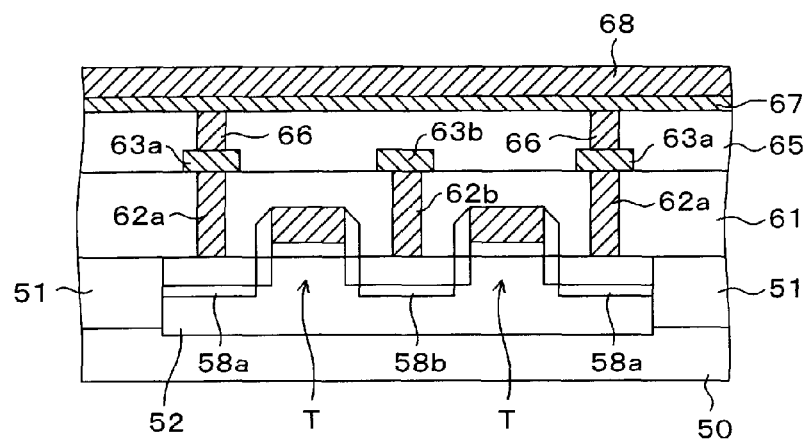
Figure 10F:
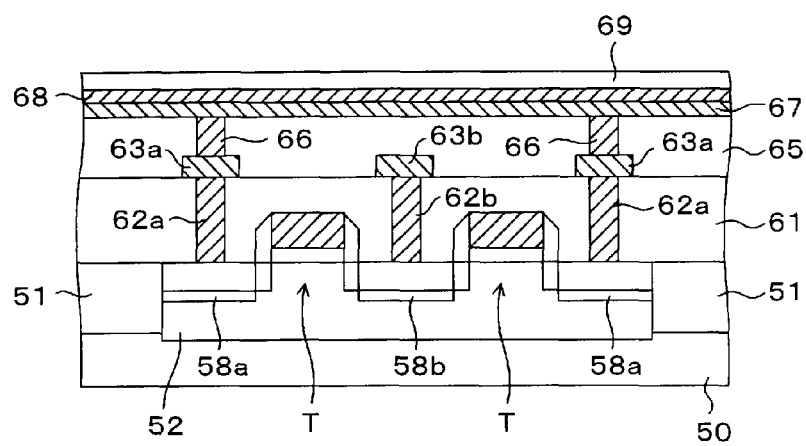

Subsequently, as depicted in FIG. 10E, by the sputtering method, a Pt film 67 serving as a lower electrode is formed with the thickness of, for example, 50 nm to 100 nm on the second interlayer insulating film 65 and the W plug 66 (on the Ti or TiN film). Thereafter, an Ni film 68 is formed with the thickness of, for example, 60 nm on the Pt film 67 by the sputtering method. After that, this semiconductor substrate 50 is placed in an electric furnace to be subjected to the thermal treatment at the temperature of 400° C. for 30 minutes in the oxidizing atmosphere. This results in oxidation of the surface of the Ni film 68. As a result, as depicted in FIG. 10F, a transition metal oxide film 69 made of NiOx is formed. With this oxidation treatment, the thickness of the Ni film 68 becomes approximately 10 nm. It should be noted that the oxidation of the Ni film 68 (transition metal film) may be performed by the RTA (Rapid Thermal Anneal) method.

Figure 10G:
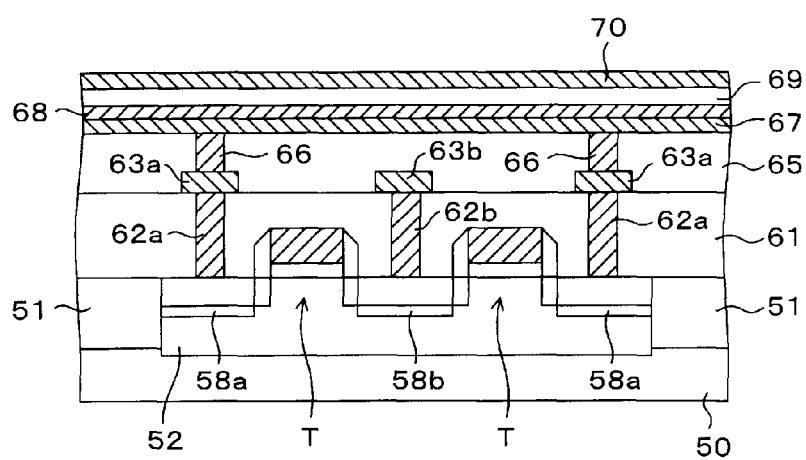

Thereafter, as depicted in FIG. 10G, by the sputtering method, a Pt film 70 serving as an upper electrode is formed with the thickness of, for example, 50 nm on the NiOx film 69. In addition, an antireflection film (unillustrated) made of TiN is formed on the Pt film 70 with the thickness of, for example, 50 nm. The antireflection film is formed in order to prevent light reflection in the next photolithography process. Therefore, it is only necessary that this antireflection film is formed if needed, and is not a must in the embodiment.

Figure 10H:
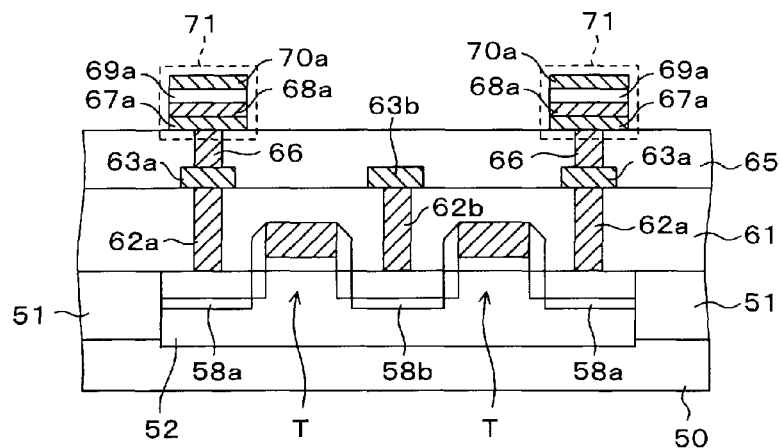

Next, the process to form the structure depicted in FIGS. 10H to 10J will be described. After the Pt film 70 is formed by the process described above, a resist film (unillustrated) having a predetermined shape is formed on the Pt film 70. By using the resultant resist film as a mask, the Pt film 70, the NiOx film 69, the Ni film 68, and the Pt film 67 are etched. As a result, as depicted in FIG. 10H, formed is a resistance change element 71 having the structure in which the lower electrode 67a made of Pt, the transition metal film 68a made of Ni, the transition metal oxide film 69a made of NiOx, and the upper electrode 70a made of Pt are laminated.

Figure 10I:
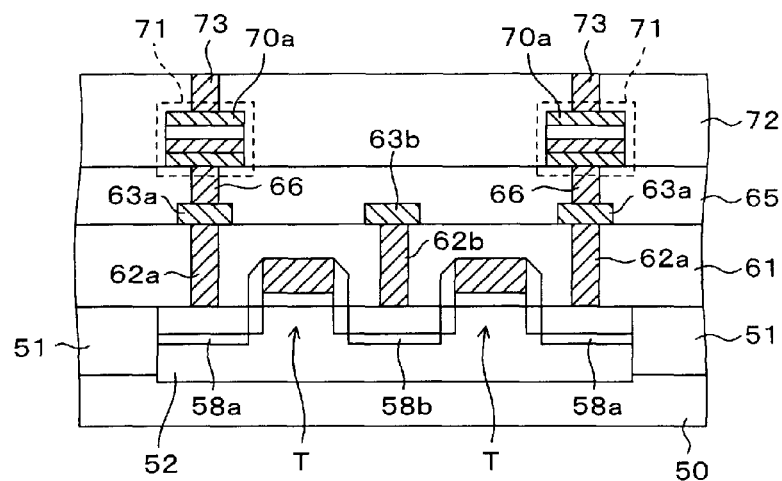
Figure 10J:
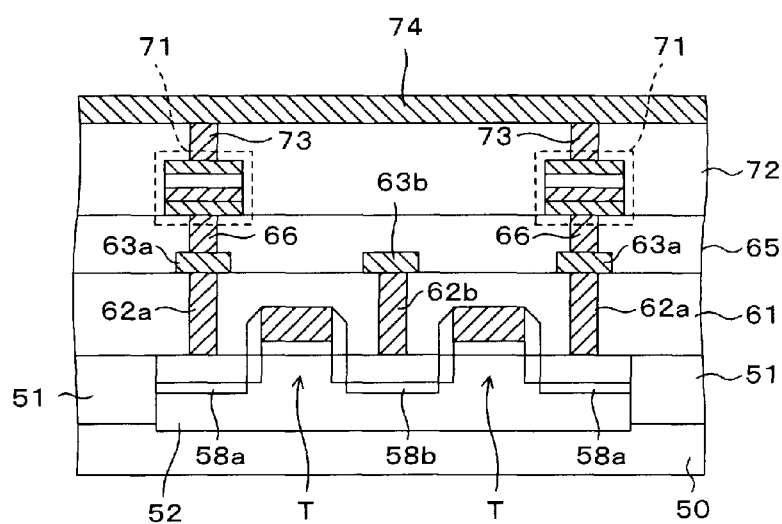

Subsequently, as depicted in FIG. 10I, a third interlayer insulating film 72 made of $SiO_2$ is formed on the entire upper surface of the semiconductor substrate 50 by the CVD method. Thereafter, by using the photolithography method and the etching method, contact holes, each reaching the upper electrode 70a of the resistance change element 71 from the upper surface of the third interlayer insulating film 72, are formed. After that, a TiN film (unillustrated) serving as a barrier metal is formed on the entire upper surface of the semiconductor substrate 50. Then, a W film is formed on the barrier metal by the sputtering method or the CVD method, and W is filled in the contact holes. Finally, the W film and the TiN film are polished by the CMP method until the third interlayer insulating film 72 is exposed. In this manner, a W plug 73 electrically connected to the upper electrode 70a of the resistance change element 71 is formed.

Thereafter, by the sputtering method, a conducting film (unillustrated) having the laminated structure of TiN/Al/TiN/Ti, for example, is formed on the third interlayer insulating film 72 and the W plug 73. After that, the conducting film is patterned by the photolithography method and the etching method to form, as depicted in FIG. 10J, a wiring (bit line) 74. In this manner, the ReRAM is completed.

In the ReRAM configured as such, the wiring 74, the gate electrode 54 of each transistor T, and the wiring 63b respectively are a bit line, a word line, and a ground line. When the resistance change element 71 is set, the transistor T is turned on to apply a predetermined voltage to the resistance change element 71 through the wiring 74 (bit line) by setting the lower electrode 67a to a ground potential. Additionally, when the resistance change element 71 is reset, the transistor T is turned on to apply a predetermined current to the resistance change element 71 through the wiring (bit line) 74 by setting the lower electrode 67a to a ground potential. Furthermore, when the state of the resistance change element 71 is detected, the transistor T is turned on to check a resistance between the wiring (bit line) 74 and the wiring 63b (ground line).

In the ReRAM according to the present embodiment, the resistance change element 71 is configured of the lower electrode 67a made of Pt, the transition metal film 68a made of Ni, the transition metal oxide film 69a made of NiOx, and the upper electrode 70a made of Pt. Therefore, there is such an effect that a driving voltage is low and a driving current is small. In this manner, the ReRAM can be highly integrated to meet such demands that information apparatuses are further reduced in size and save power consumption while having higher functionality.

Note that, the present embodiment has been described by using the example in which the present embodiment is applied to a stack-type ReRAM. However, the present embodiment is also applicable to a planer-type ReRAM.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A method of manufacturing a resistance change element, comprising:
    forming a first noble metal film made of any one of a noble metal and a noble metal oxide above a semiconductor substrate;
    forming a transition metal film on the first noble metal film;
    forming a transition metal oxide film on the transition metal film by oxidizing a surface of the transition metal film while directly exposing the surface of the transition metal film to an oxidizing atmosphere; and
    forming a second noble metal film made of any one of a noble metal and a noble metal oxide on the transition metal oxide film after the forming the transition metal oxide film.

2. The method of manufacturing a resistance change element according to claim 1, wherein the oxidation of the surface of the transition metal film is performed using an electric furnace.

3. The method of manufacturing a resistance change element according to claim 1, wherein the oxidation of the surface of the transition metal film is performed by a rapid thermal anneal method.

4. The method of manufacturing a resistance change element according to claim 1, wherein a thickness of the transition metal film after formation of the transition metal oxide film is between 5 nm and 20 nm inclusive while a thickness of the transition metal oxide film is between 5 nm and 65 nm inclusive.

* * * * *